(12) United States Patent
Dani et al.

(10) Patent No.: US 7,332,807 B2
(45) Date of Patent: Feb. 19, 2008

(54) CHIP PACKAGE THERMAL INTERFACE MATERIALS WITH DIELECTRIC OBSTRUCTIONS FOR BODY-BIASING, METHODS OF USING SAME, AND SYSTEMS CONTAINING SAME

(75) Inventors: Ashay A. Dani, Chandler, AZ (US); Anna M. Prakash, Chandler, AZ (US); Saikumar Jayaraman, Chandler, AZ (US); Mitesh Patel, Phoenix, AZ (US); Vijay S. Wakharkar, Paradise Valley, AZ (US)

(73) Assignee: Intel Corporation, Santa Clara, CA (US)

( * ) Notice: Subject to any disclaimer, the term of this patent is extended or adjusted under 35 U.S.C. 154(b) by 9 days.

(21) Appl. No.: 11/323,512

(22) Filed: Dec. 30, 2005

(65) Prior Publication Data
US 2007/0158823 A1    Jul. 12, 2007

(51) Int. Cl.
*H01L 23/10* (2006.01)
*H05K 7/20* (2006.01)

(52) U.S. Cl. ............... 257/706; 257/707; 257/717; 257/719; 257/E23.101; 257/E23.11; 257/E23.178; 257/E23.107; 361/704; 361/709; 361/712; 361/714

(58) Field of Classification Search ............... 257/675, 257/701, 706, 707, 712–722, E33.075, E31.131, 257/E23.08–E23.111, E23.169–E23.178
See application file for complete search history.

(56) References Cited

U.S. PATENT DOCUMENTS

| | | | |
|---|---|---|---|
| 6,519,154 B1 * | 2/2003 | Chiu ........................... | 361/704 |
| 6,651,736 B2 * | 11/2003 | Chiu et al. ................... | 165/185 |
| 2006/0039118 A1 * | 2/2006 | Jafari et al. .................. | 361/719 |

OTHER PUBLICATIONS

Dani, A. A., et al., "Chip Package Dielectric Sheet For Body-Biasing, Methods of Using Same, and Systems Containing Same", U.S. Appl. No. 11/323,243, filed Dec. 30, 2005.

* cited by examiner

*Primary Examiner*—Jasmine Clark
(74) *Attorney, Agent, or Firm*—Schwegman, Lundberg & Woessner, P.A.

(57) ABSTRACT

A chip package includes a thermal interface material disposed between a die backside and a heat sink. The thermal interface material includes a first metal particle that is covered by a dielectric film. The dielectric film is selected from an inorganic compound of the first metal or an inorganic compound coating of a second metal. The dielectric film diminishes overall heat transfer from the first metal particle in the thermal interface material by a small fraction of total possible heat transfer without the dielectric film. A method of operating the chip includes biasing the chip with the dielectric film in place.

19 Claims, 4 Drawing Sheets

CHIP PACKAGE THERMAL INTERFACE MATERIALS WITH DIELECTRIC OBSTRUCTIONS FOR BODY-BIASING, METHODS OF USING SAME, AND SYSTEMS CONTAINING SAME

TECHNICAL FIELD

Embodiments relate generally to a chip package fabrication. More particularly, embodiments relate to heat-transfer and current-leakage issues in chip packages.

TECHNICAL BACKGROUND

Issues that affect packaged integrated circuit (IC) devices include heat management, current leakage, and clock speed, among others. An IC die that cannot adequately reject heat will be adversely affected in clock speed. An IC die that has significant current leakage through the backside will also be adversely affected in clock speed.

As die size and package size continue to be miniaturized, current leakage may exceed the current demand to operate the IC die. The mobile IC die segment of packaged IC devices is a particularly vulnerable area of technology as it is desired to improve battery life by decreasing electrical current demand, particularly by reducing current leakage through the backside surface of the die.

BRIEF DESCRIPTION OF THE DRAWINGS

In order to depict the manner in which the embodiments are obtained, a more particular description of embodiments briefly described above will be rendered by reference to exemplary embodiments that are illustrated in the appended drawings. Understanding that these drawings depict only typical embodiments that are not necessarily drawn to scale and are not therefore to be considered to be limiting of its scope, the embodiments will be described and explained with additional specificity and detail through the use of the accompanying drawings in which.

DETAILED DESCRIPTION

Embodiments in this disclosure relate to an apparatus that includes a plurality of dielectric-coated metal particles for heat transfer between an IC die and a heat spreader. Embodiments relate to both inorganic and organic matrices into which the plurality of dielectric-coated metal particles can be dispersed. Embodiments also relate to reworkable flexible and rigid thermal interface materials that contain a plurality of dielectric-coated metal particles. Embodiments also relate to processes of assembling into chip packages, thermal interface materials that contain a plurality of dielectric-coated metal particles. Embodiments also relate to systems that incorporate a plurality of dielectric-coated metal particles into a thermal interface material.

The following description includes terms, such as upper, lower, first, second, etc. that are used for descriptive purposes only and are not to be construed as limiting. The embodiments of an apparatus or article described herein can be manufactured, used, or shipped in a number of positions and orientations. The terms "die" and "chip" generally refer to the physical object that is the basic workpiece that is transformed by various process operations into the desired integrated circuit device. A die is usually singulated from a wafer, and wafers may be made of semiconducting, non-semiconducting, or combinations of semiconducting and non-semiconducting materials. A board is typically a resin-impregnated fiberglass structure that acts as a mounting substrate for the die.

Reference will now be made to the drawings wherein like structures will be provided with like suffix reference designations. In order to show the structures of various embodiments most clearly, the drawings included herein are diagrammatic representations of integrated circuit structures. Thus, the actual appearance of the fabricated structures, for example in a photomicrograph, may appear different while still incorporating the essential structures of the illustrated embodiments. Moreover, the drawings show the structures necessary to understand the illustrated embodiments. Additional structures known in the art have not been included to maintain the clarity of the drawings.

Figure 1:
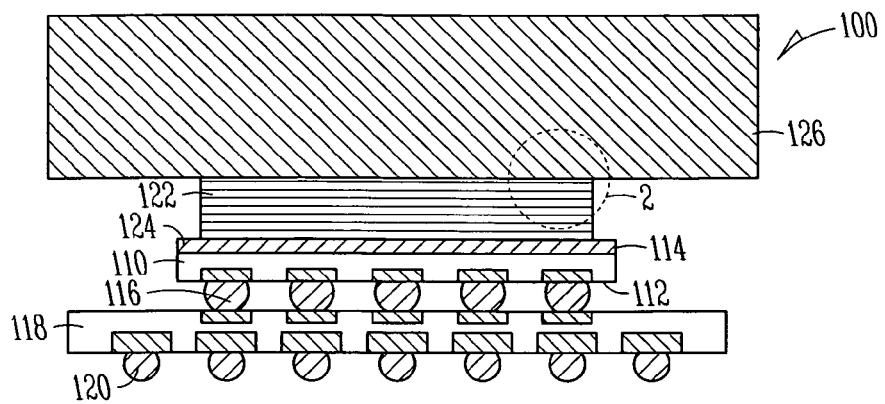
FIG. 1 is a cross-section elevation of an apparatus that includes a plurality of dielectric-coated metal particles in a thermal interface material according to an embodiment.

FIG. 1 is a cross-section elevation of an apparatus 100 that includes a plurality of dielectric-coated metal particles in a thermal interface material according to an embodiment. The apparatus 100 includes a die 110 with an active surface 112 and a backside surface 114. The die 110 can be electrically bumped by a plurality of solder bumps, one of which is designated with the reference numeral 116. The die 110 is disposed upon a mounting substrate 118 that can be a board such as a printed wiring board, an interposer, a mezzanine board, an expansion card, a motherboard, or other mounting substrates. Electrical communication between the die 110 and the outside world can be achieved by a plurality of mounting substrate bumps, one of which is designated with the reference numeral 120 according to an embodiment.

The die 110 is thermally coupled to a thermal interface material (TIM) 122 that is a significant conductor of heat. In an embodiment, the die 110 includes a backside metallurgy 124 (BSM) that can be applied during the wafer phase of processing. The BSM 124 can assist the TIM 122 in adhering to the die 110. For example in FIG. 1, the die 110 and the TIM 122 are depicted as including the BSM 124 bonded to the die 110 and to the TIM 122 as a unit. The die 110, the BSM 124, and the TIM 122 are thermally coupled to a heat sink 126. Accordingly, electrically conductive paths between the die 110 and the heat sink 126 are obstructed by the plurality of dielectric-coated metal particles 122.

The thermal solution for conductively cooling the die 110 includes extracting heat through the backside surface 114 of the die 110 and into the heat sink 126. In an embodiment, the TIM 122 includes a plurality of metal particles such as copper, aluminum, silver, tin, tin-silver, tin-indium-silver, and the like, which metal particles are coated with a dielectric film. In an embodiment, the TIM 122 is a dielectric-coated metal and polymer hybrid, which is often referred to as a polymer-solder hybrid (PSH). In an embodiment, the TIM 122 is a dielectric-coated metal and resin hybrid, which can have a rigidity greater than a PSH. In an embodiment, the TIM 122 is a dielectric-coated metal and thermal grease hybrid, which allows for significant thermal expansion and contraction of the TIM 122. In an embodiment, the TIM 122 is a dielectric-coated metal and silicone compound hybrid. In an embodiment, the TIM 122 is a dielectric-coated metal and epoxy hybrid. In an embodiment, the TIM 122 is a dielectric-coated metal and phase-change material hybrid. Accordingly, the phase-change material can be designed to change phase in a temperature range between room temperature and the heat-rejection temperature of the IC die that is packaged with the TIM.

In an embodiment, the BSM 124 is a titanium compound such as sputtered titanium metal. In an embodiment, the BSM 124 includes a titanium first layer disposed against the bare die 110 at the backside surface 114, and a multiphasic, lead-free solder second layer disposed on the first layer. In an embodiment, the lead-free solder second layer is a material with a bulk solder phase such as AgSn, CuSn, AgCu, AgCuSn, and the like.

In addition to the lead-free solder bulk phase, the lead-free solder second layer includes an intermetallic second phase that liquefies and dissolves into the first phase during die-attach processing. The intermetallic second phase includes an InBiZn as an additive to the first phase. The intermetallic second phase causes enhanced wetting upon the titanium first layer at a temperature range from about 95° C. to about 110° C. In this embodiment, the lead-free solder second layer is an AgSn solder first phase that includes about 80% to about 95% of the solder, and the intermetallic-forming second phase is a zinc-gold-indium intermetallic compound that includes the balance of the solder by weight, about 5% to about 20%. In this embodiment, the zinc-gold-indium intermetallic compound is present with about three parts zinc, five parts Au, and about one part indium.

Figure 2:
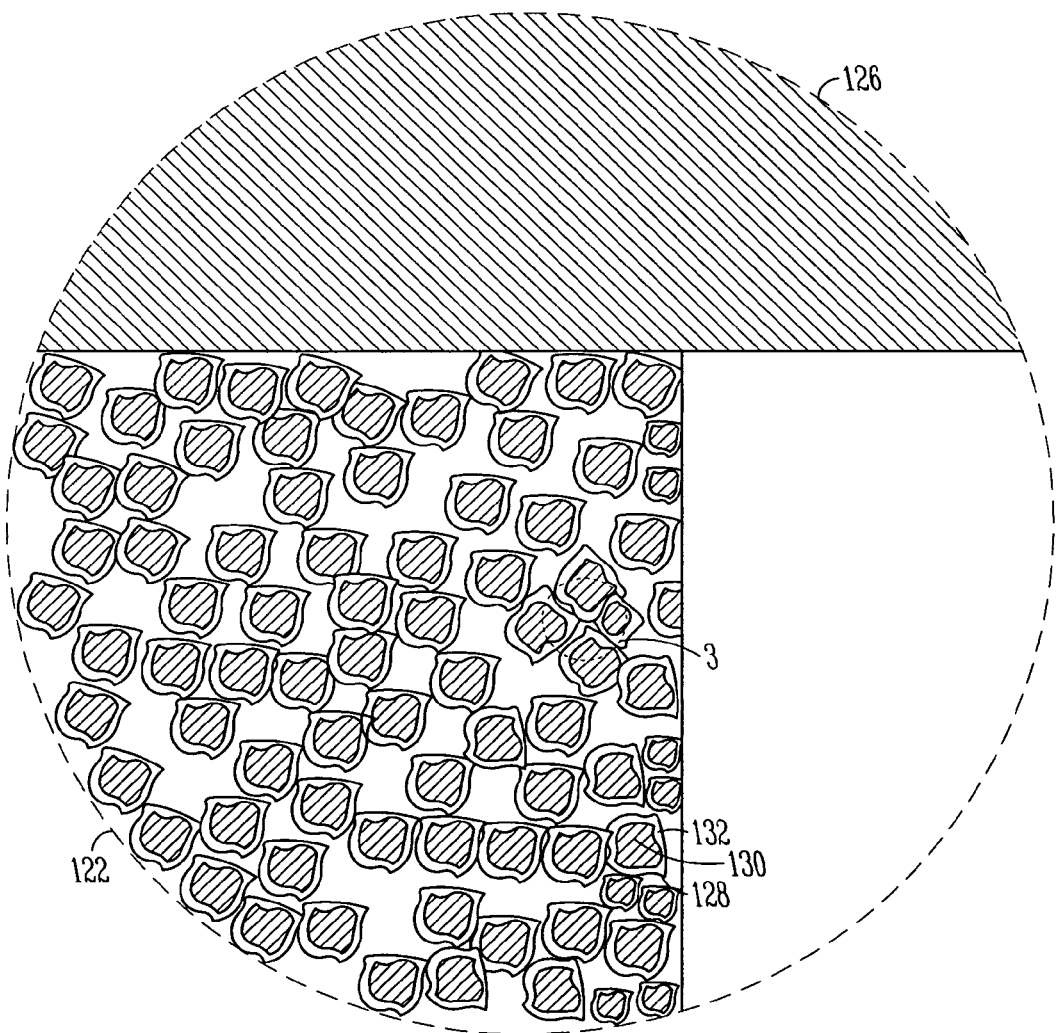
FIG. 2 is a detail section taken from the apparatus depicted in FIG. 1 according to an embodiment.

FIG. 2 is a detail section taken from the apparatus 100 depicted in FIG. 1 according to an embodiment. The detail section is taken along the line 2, which includes the TIM 122 and the heat sink 126. The detail section also reveals the plurality of metal particles, one of which is designated with the reference numeral 128. In an embodiment, each particle of the plurality of metal particles 128 includes a metal core 130 and a dielectric film 132 upon the metal core 130. In an embodiment, a majority of the first metal particles 128 includes a metal core 130 and a dielectric film 132, but a minority of the first metal particles 128 includes a metal core and a less than complete dielectric film 132. In an embodiment, a majority of the first metal particles 128 includes a metal core 130 and a dielectric film 132, but in the majority of the first metal particles 128 with a dielectric film 132, a plurality of the first metal particles 128 includes a metal core and a complete dielectric film 132. In other words by way of example, a plurality of first metal particles 128, e.g., 40 percent thereof are completely encapsulated by a dielectric film 132, 30 percent of the metal particles are less than completely encapsulated by a dielectric film 132, and 30 percent of the metal particles 128 have no dielectric film.

The combination of the metal core 130 and the dielectric film 132 thereupon in the TIM 122 results in a decreased heat-transfer capability, compared to a TIM 122 containing all metal particles 128 without a dielectric film 132. In other words, if all of the metal particles 130 had no dielectric film 132, the TIM 122 could perform with a heat-transfer capability of unity, i.e., in dimensionless units such as in Watts/m². But in this disclosure, the TIM 122 includes the metal core 130 and the dielectric film 132, and consequently the dielectric film 132 decreases the heat-transfer capability of the TIM 122 by not more than about 20 percent of unity according to an embodiment. In an embodiment, the dielectric film 132 decreases the heat-transfer capability of the TIM 122 compared to the metal particles alone, by not more than about 10 percent of unity. In an embodiment, the dielectric film 132 decreases the heat-transfer capability of the TIM 122 compared to metal particles alone, by not more than about one percent of unity. In an embodiment, the dielectric film 132 decreases the heat-transfer capability of the TIM 122 compared to metal particles alone, by not more than about 0.5 percent of unity.

Figure 3:
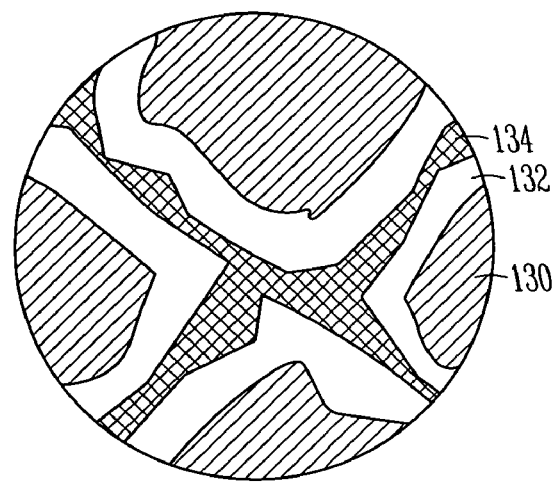
FIG. 3 is detail section taken from the structure depicted in FIG. 2 according to an embodiment.

FIG. 3 is detail section taken from the structure depicted in FIG. 2 according to an embodiment. The detail section is taken along the line 3, which includes the metal core 130 and the dielectric film 132 thereupon. The detail section also reveals a matrix 134 in which the plurality of first metal particles 128 is dispersed according to an embodiment. In an embodiment, the metal core 130 has an average-diameter particle size range from about 20 nanometers to about 25 micrometers. In an embodiment, the metal core 130 has an average-diameter particle size range from about 20 nanometers to about 1,000 nanometers and the dielectric film 132 on particles of this size range has a thickness, relative to the average-diameter particle size in a range from about 0.1 percent to about 1 percent. In an embodiment, the metal core 130 has an average-diameter particle size range from about 0.1 micrometers to about 25 micrometers and the dielectric film 132 on particles of this size range has a thickness, relative to the average-diameter particle size in a range from about 1 percent to about 5 percent.

In an embodiment, the TIM 122 has a thickness of about 1,000 micrometers (μm). In an embodiment, the TIM 122 has a thickness of about 500 μm. In an embodiment, the TIM 122 has a thickness of about 100 μm. In an embodiment, the TIM 122 has a thickness of about 50 μm. In an embodiment, the TIM 122 has a thickness of about 10 μm. In an embodiment, the TIM 122 has a thickness that is about twice the thickness of the average-diameter particle size of the metal core 130. Accordingly the TIM 122 can have a thickness that is greater than the diameter smallest metal core 130 by about double. In an embodiment, the TIM 122 has a thickness that is about 10 times the average-diameter particle size of the metal core 130. In an embodiment, the TIM 122 has a thickness that is about 100 times the thickness of the average-diameter particle size of the metal core 130. In an embodiment, the TIM 122 has a thickness that is about 500 times the thickness of the average-diameter particle size of the metal core 130. In an embodiment, the TIM 122 has a thickness that is about 1,000 times the thickness of the average-diameter particle size of the metal core 130.

Preparation of the TIM 122, including the dielectric-coated particles 122 can be done, for example, by kneading the dielectric-coated particles 122 with a polymer matrix material 134, such that a substantially uniformly blended composite is achieved. Accordingly in an embodiment, the dielectric film 132 is entirely surrounded by the matrix 134 such that an additional layer of dielectric material, the matrix 134, obstructs eclectically conductive paths between the die 110 and the heat sink 126. Where the TIM 122 includes a first metal of the core 130, the dielectric film 132 of any disclosed type, and the matrix 134 includes a second metal as disclosed, preparation of the TIM 122 can include blending of the plurality of first metal particles 128 with a powder of second metal particles, followed by sintering or heating to achieve the liquidus temperature of the second metal, and by optional pressing during sintering or liquidus heating.

Metal Cores and Dielectric Films

The metal core 130 can be processed according to various embodiments to obtain the dielectric film 132. In an embodiment, the dielectric film 132 is a corrosion result of the metal core 130. For example, where the metal core is copper, the dielectric film 132 is copper oxide according to an embodiment. In an embodiment, the dielectric film 132 is a nitride of the metal core 130. In an embodiment, the dielectric film 132 is an oxynitride of the metal core 130. In an embodiment, the dielectric film 132 is a carbide of the metal core 130. In an embodiment, the dielectric film 132 is a sulfide of the metal core 130. In an embodiment, the dielectric film 132 is a boride of the metal core 130. In an embodiment, the dielectric film 132 is a boronitride of the metal core 130. Other qualitative corrosion results of the metal core 130 can be used. Additionally, any disclosed quantitative thickness for the dielectric film 132 as a percentage of the average diameter of any disclosed metal core 130, can be combined with any disclosed TIM 122 thickness to achieve several embodiments. For example, a metal core 130 of copper has an average particle diameter of about 20 μm and a $Cu_2O$ dielectric film 132 that is about three percent of the 20 μm average particle diameter.

Preparation of the dielectric film 132 to achieve a corrosion result can be done, for example, by heating the metallic particles in an oxidating environment. In an embodiment, the metal core 130 is treated in a fluidized bed of corrosive gas. For example, a plurality of copper particles 130 is fluidized in an oxygen-sparging environment until the copper particles have a copper metal core 130 and have grown a copper oxide dielectric film 132. Similarly, a plurality of copper particles is fluidized in an ammonia and nitrogen-sparging environment until the copper particles have a copper metal core 130 and a have grown a copper nitride dielectric film 132.

In an embodiment, the dielectric film 132 is an applied coating on the metal core 130. For example, where the metal core is copper, the dielectric film 132 includes boron nitride, which is formed upon the copper by a process such as chemical vapor deposition (CVD). Accordingly, the metal core 130 includes a first metal or a first metal alloy, and the dielectric film 132 includes a compound that is derived from a second metal or second metal alloy. In an embodiment, the first metal or first metal alloy of the metal core 130 is combined with a dielectric film 132 that is an oxide of the second metal that is unlike the first metal or metal alloy. By "unlike the first metal or metal alloy", it is meant that an analytical chemist of ordinary skill could determine by conventional analysis that the first metal and the second metal have detectably qualitatively different properties. In an embodiment, the first metal or first metal alloy of the metal core 130 is combined with a dielectric film 132 that is a metal-nitride of the second metal that is unlike the first metal. In an embodiment, the first metal or first metal alloy of the metal core 130 is combined with a dielectric film 132 that is an oxynitride of the second metal. In an embodiment, the first metal or first metal alloy of the metal core 130 is combined with a dielectric film 132 that is carbide of the second metal. In an embodiment, the first metal or first metal alloy of the metal core 130 is combined with a dielectric film 132 that is a sulfide of the second metal. In an embodiment, the first metal or first metal alloy of the metal core 130 is combined with a dielectric film 132 that is a boride of the second metal. In an embodiment, the first metal or first metal alloy of the metal core 130 is combined with a dielectric film 132 that is a boronitride of the second metal.

Preparation of the dielectric film 132 to achieve an applied-coating result can be done, for example, by PVD of a mechanically agitated bed of metallic particles in a PVD tool. In an embodiment, a PVD tool includes a vibrating device, which vibrates a boat that contains a thin layer of copper particles. Vibration of the boat keeps the metallic particles fluidized during which time PVD of, e.g., BN is carried out on the copper particles until the copper particles have a copper metal core 130 and a have grown a BN dielectric film 132.

TIM Matrix Materials

Where the TIM 122 includes a matrix 134, the matrix has the quality of adhesion to the heat sink 136 and to the die 110 or to the BSM 124 if present. In an embodiment, the matrix 134 is a polymer. In an embodiment, the matrix 134 is a resin. In an embodiment, the matrix 134 is a thermal grease. In an embodiment, the matrix 134 is a silicone compound. In an embodiment, the matrix 134 is an epoxy. In an embodiment, the matrix is 134 a phase-change material. In an embodiment, the matrix 134 is a second metal compared to the first metal of the metal core 130. In an embodiment, however, the second metal can be substantially chemically the same metal as the first metal of the metal core 130, but the metal core 130 includes a dielectric film 132, whether it is a corrosion product or an adhesion product as set forth in this disclosure.

Figure 4:
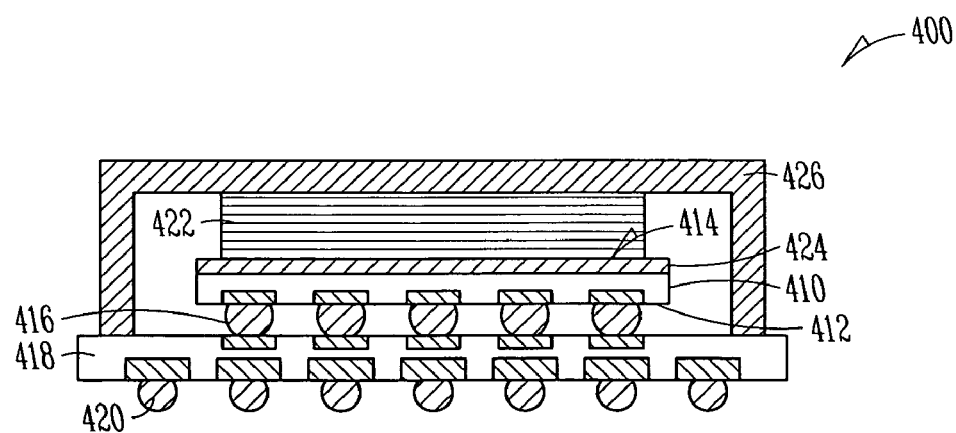
FIG. 4 is a cross-section elevation of an apparatus that includes a thermal interface material that contains a plurality of dielectric-coated metal particles in an integrated heat spreader package according to an embodiment.

FIG. 4 is a cross-section elevation of an apparatus 400 that includes a thermal interface material that contains a plurality of dielectric-coated metal particles in an integrated heat spreader package according to an embodiment. The apparatus 400 includes a die 410 with an active surface 412 and a backside surface 414. The die 410 can be electrically bumped by a plurality of solder bumps, one of which is designated with the reference numeral 416. The die 410 is disposed upon a mounting substrate 418 that can be a board such as a printed wiring board, an interposer, a mezzanine board, an expansion card, a motherboard, or other mounting substrates. Electrical communication between the die 410 and the outside world can be achieved by a plurality of mounting substrate bumps, one of which is designated with the reference numeral 420 according to an embodiment.

The die 410 is thermally coupled to a TIM 422 that is a significant conductor of heat. In an embodiment, the die 410 includes a BSM 424 that can be applied during the wafer phase of processing. The BSM 424 can assist the TIM 422 in adhering to the die 410. For example in FIG. 4, the die 410 and the TIM 422 are depicted as including the BSM 424 bonded to the die 410 and to the TIM 422 as a unit. The die 410, the BSM 424, and the TIM 422 are thermally coupled to a heat sink 426. Accordingly, electrically conductive paths between the die 410 and the integrated heat spreader 426 are obstructed by the dielectric-coating (e.g. 132, FIG. 3) on the metal particles 130. Similarly, where the matrix 134 is also dielectric, electrically conductive paths between the die 410 and the integrated heat spreader 426 are obstructed by the matrix 134.

The thermal solution for conductively cooling the die 410 includes extracting heat through the backside surface 414 of the die 410 and into the integrated heat spreader 426.

The combination of the metal core and the dielectric film thereupon in the TIM 422 results in a decreased heat-transfer capability; compared to if the TIM 422 contained the metal particles without a dielectric film. In other words, if the metal particles had no dielectric film, the TIM 422 could perform with a heat-transfer capability of unity, i.e., in dimensionless units such as in Watts/m². But in this disclosure, the TIM 422 includes the metal core and the dielectric film, and consequently the dielectric film decreases the heat-transfer capability of the TIM 422 by not more than about 20 percent of unity according to an embodiment. In an embodiment, the dielectric film decreases the heat-transfer capability of the TIM 422 compared to the metal particles alone, by not more than about 10 percent of unity. In an embodiment, the dielectric film decreases the heat-transfer capability of the TIM 422 compared to metal particles alone, by not more than about one percent of unity. In an embodiment, the dielectric film decreases the heat-transfer capability of the TIM 422 compared to metal particles alone, by not more than about 0.5 percent of unity.

Figure 5:
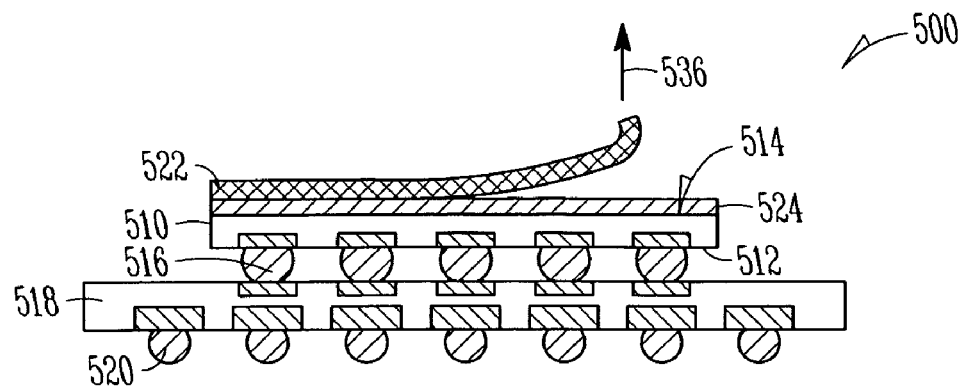
FIG. 5 is a cross-section elevation of an apparatus during the reworking of a flexible thermal interface material that contains a plurality of dielectric-coated metal particles according to an embodiment.

FIG. 5 is a cross-section elevation of an apparatus during the reworking of a flexible thermal interface material that contains a plurality of dielectric-coated metal particles according to an embodiment. The apparatus 500 includes a die 510 with an active surface 512 and a backside surface 514. The die 510 can be electrically bumped by a plurality of solder bumps, one of which is designated with the reference numeral 516. The die 510 is disposed upon a mounting substrate 518 that can be a board such as a printed wiring board, an interposer, a mezzanine board, an expansion card, a motherboard, or other mounting substrates. Electrical communication between the die 510 and the outside world can be achieved by a plurality of mounting substrate bumps, one of which is designated with the reference numeral 520 according to a embodiment.

In an embodiment, reworking of the thermal solution for the die 510 includes removing a TIM 522 and installing a replacement TIM. As depicted in FIG. 5, the TIM 522 is disposed directly upon a BSM 524 of the die 510. Where the TIM 522 is flexible, it can be peeled off the BSM 524 if present, or it can be peeled off the backside surface 514 of the die 510 if the BSM 524 is not present. The TIM 522 is being peeled off in the direction of the directional arrow 536.

Reworking the thermal solution according to these embodiments can be achieved during initial processing before shipping, if a different TIM is desired to replace the TIM 522. Similarly, reworking the thermal solution according to these embodiments can be achieved after shipping, i.e., if the apparatus 500 requires a different thermal solution than that with it was shipped.

Figure 6:
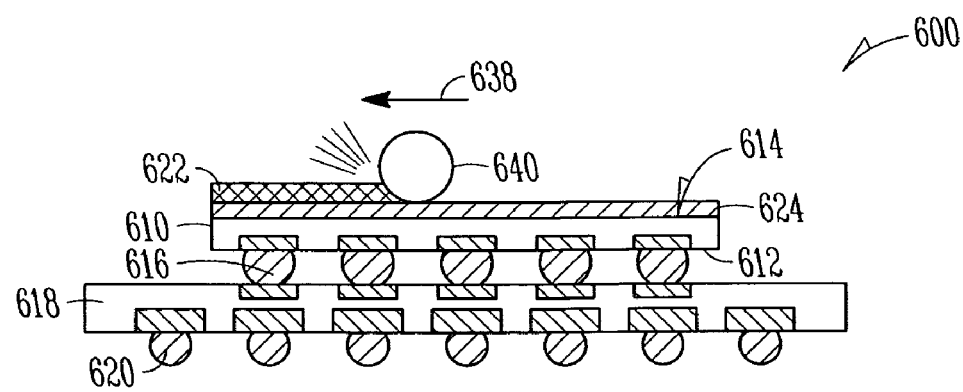
FIG. 6 is a cross-section elevation of an apparatus during the reworking of a rigid thermal interface material that contains plurality of dielectric-coated metal particles according to an embodiment.

FIG. 6 is a cross-section elevation of an apparatus 600 during the reworking of a rigid thermal interface material that contains plurality of dielectric-coated metal particles according to an embodiment. The apparatus 600 includes a die 610 with an active surface 612 and a backside surface 614. The die 610 can be electrically bumped by a plurality of solder bumps, one of which is designated with the reference numeral 616. The die 610 is disposed upon a mounting substrate 618 that can be a board such as a printed wiring board, an interposer, a mezzanine board, an expansion card, a motherboard, or other mounting substrates. Electrical communication between the die 610 and the outside world can be achieved by a plurality of mounting substrate bumps, one of which is designated with the reference numeral 620 according to a embodiment.

In an embodiment, reworking of the thermal solution for the die 610 includes removing a TIM 622 and installing a replacement TIM. As depicted in FIG. 6, the TIM 622 is disposed directly upon a BSM 624 of the die 610. Where the TIM 622 is rigid such as an oxide, a nitride, a metal matrix, or others, it can be removed from the BSM 624 by grinding if present, or it can be ground off the backside surface 614 of the die 610 if the BSM 624 is not present. The TIM 622 is being ground off in the direction of the directional arrow 638, with a grinding wheel 640 according to an embodiment.

Reworking the thermal solution according to these embodiments can be achieved during initial processing if a different TIM is desired to replace the TIM 622. Similarly, reworking the thermal solution according to these embodiments can be achieved after shipping, i.e., if the apparatus 600 requires a different thermal solution than that with it was shipped.

In an embodiment, a method of operating an IC device includes applying a bias to a die. Reference is made to FIG. 1. In an embodiment, a bias that is a fraction of the voltage requirement of the die 110 is applied across the solder bumps 116, such that a field effect is imposed upon the entire integrated circuitry of the die 110. Accordingly, current leakage diminishes. In an embodiment, a bias in a range from about five percent to about 50 percent of the voltage requirement of the die 110 is applied across the solder bumps 116, such that a field effect is imposed upon the entire integrated circuitry of the die 110. Accordingly, current leakage diminishes. In an embodiment, the voltage that is applied is a range from about 1 Volt to about 6 Volts. In an embodiment, a bias of about five percent of the voltage requirement of the die 110, about 3.5 Volts, is applied across the solder bumps 116, such that a field effect is imposed upon the entire integrated circuitry of the die 110. Accordingly, current leakage diminishes.

In an embodiment, the IC device that includes a TIM that contains a plurality of dielectric-coated metal particles embodiment is a mobile device such as the apparatus 100 depicted in FIG. 1. In an embodiment, the IC device is a desktop device such as the apparatus 400 depicted in FIG. 4.

Figure 7:
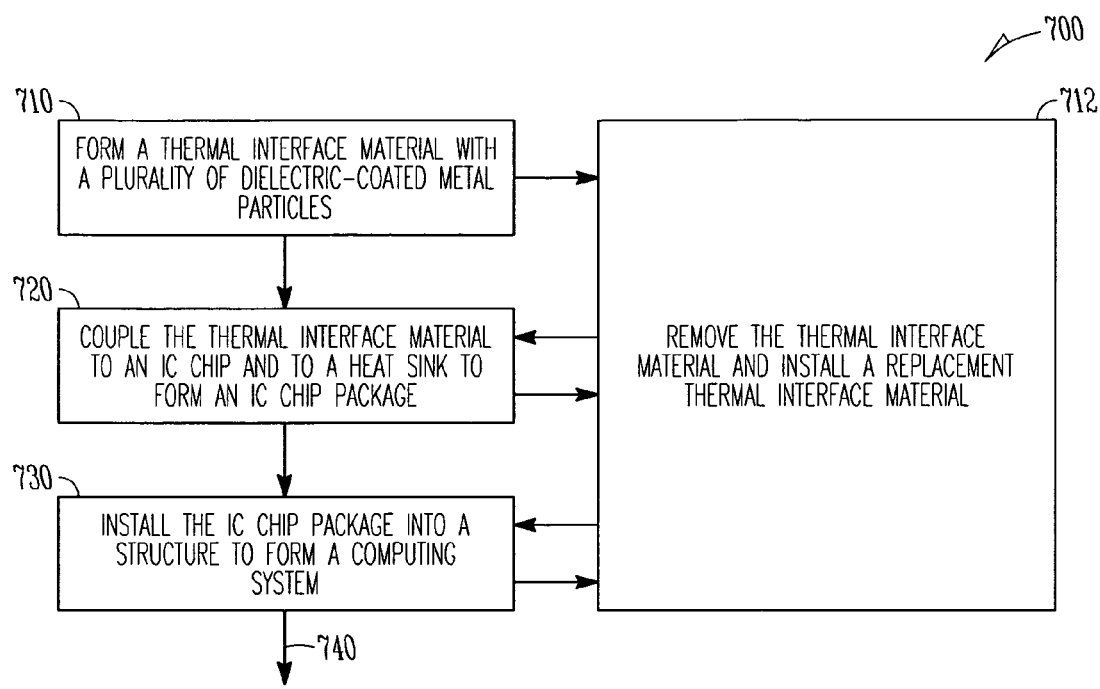
FIG. 7 is a flow chart that describes process flow embodiments.

FIG. 7 is a flow chart that describes process flow embodiments 700.

At 710, the process includes forming a TIM that includes a plurality of dielectric-coated metallic particles. In an embodiment, the process includes forming a dielectric coating on the metal core, whether as a corrosion product or as an applied film. In an embodiment, the process commences and terminates at 710. At 712, the process includes removing the TIM and installing a replacement TIM.

At 720, the process includes coupling the TIM embodiment between an IC die and a heat sink to form an IC chip package. In an embodiment, the process commences at 710 and terminates at 720. In an embodiment, the process commences and terminates at 720. At 712, the process includes removing the TIM and installing a replacement TIM, followed by coupling the TIM embodiment between an IC die and a heat sink to form an IC chip package at 720.

At 730, the process includes installing the IC chip package into a structure to form a computing system. In an embodiment, the process commences at 730 and terminates at 730. In an embodiment, the process commences at 710 and terminates at 740. In an embodiment, the process commences at 720 and terminates at 740. At 712, the process includes removing the TIM and installing a replacement TIM, followed by installing the IC chip package into a structure to form a computing system at 730.

Figure 8:
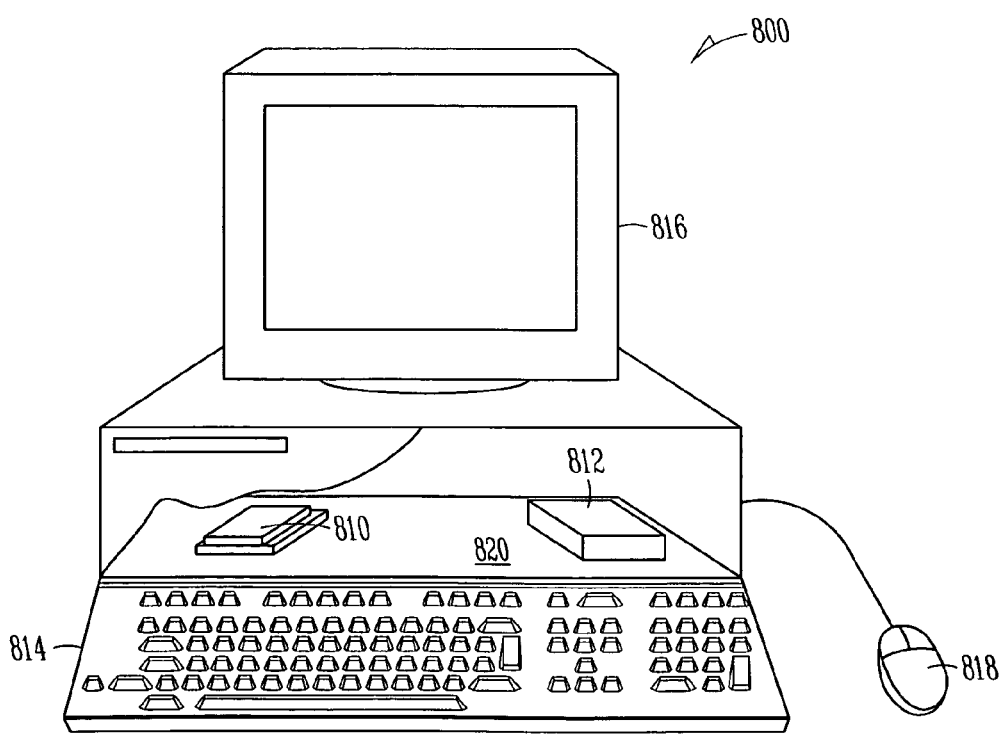
FIG. 8 is a cut-away elevation that depicts a computing system according to an embodiment.

FIG. 8 is a cut-away elevation that depicts a computing system 800 according to an embodiment. One or more of the foregoing embodiments of the TIM-containing plurality of dielectric-coated metal particles may be utilized in a computing system, such as a computing system 800 of FIG. 8. Hereinafter any TIM-containing plurality of dielectric-coated metal particles embodiment alone or in combination with any other embodiment is referred to as an embodiment(s) configuration.

The computing system 800 includes at least one processor (not pictured), which is enclosed in an IC chip package 810, a data storage system 812, at least one input device such as a keyboard 814, and at least one output device such as a monitor 816, for example. The computing system 800 includes a processor that processes data signals, and may include, for example, a microprocessor, available from Intel Corporation. In addition to the keyboard 814, the computing system 800 can include another user input device such as a mouse 818, for example. The computing system 800 can include a structure, after processing as depicted in FIGS. 1, 2, and 3, including the die 110, the plurality of dielectric-coated metal particles 128, optionally the matrix 134, and the heat spreader 126.

For purposes of this disclosure, a computing system 800 embodying components in accordance with the claimed subject matter may include any system that utilizes a microelectronic device system, which may include, for example, at least one of the TIM-containing plurality of dielectric-coated metal particles embodiments that is coupled to data storage such as dynamic random access memory (DRAM), polymer memory, flash memory, and phase-change memory. In this embodiment, the embodiment(s) is coupled to any combination of these functionalities by being coupled to a processor. In an embodiment, however, an embodiment(s) configuration set forth in this disclosure is coupled to any of these functionalities. For an example embodiment, data storage includes an embedded DRAM cache on a die. Additionally in an embodiment, the embodiment(s) configuration that is coupled to the processor (not pictured) is part of the system with an embodiment(s) configuration that is coupled to the data storage of the DRAM cache. Additionally in an embodiment, an embodiment(s) configuration is coupled to the data storage 812.

In an embodiment, the computing system 800 can also include a die that contains a digital signal processor (DSP), a micro controller, an application specific integrated circuit (ASIC), or a microprocessor. In this embodiment, the embodiment(s) configuration is coupled to any combination of these functionalities by being coupled to a processor. For an example embodiment, a DSP is part of a chipset that may include a stand-alone processor and the DSP as separate parts of the chipset on the board 820. In this embodiment, an embodiment(s) configuration is coupled to the DSP, and a separate embodiment(s) configuration may be present that is coupled to the processor in the IC chip package 810. Additionally in an embodiment, an embodiment(s) configuration is coupled to a DSP that is mounted on the same board 820 as the IC chip package 810. It can now be appreciated that the embodiment(s) configuration can be combined as set forth with respect to the computing system 800, in combination with an embodiment(s) configuration as set forth by the various embodiments of the TIM-containing plurality of dielectric-coated metal particles within this disclosure and their equivalents.

It can now be appreciated that embodiments set forth in this disclosure can be applied to devices and apparatuses other than a traditional computer. For example, a die can be packaged with an embodiment(s) configuration, and placed in a portable device such as a wireless communicator or a hand-held device such as a personal data assistant and the like. Another example is a die that can be packaged with an embodiment(s) configuration and placed in a vehicle such as an automobile, a locomotive, a watercraft, an aircraft, or a spacecraft.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. An apparatus comprising:
a die including an active surface and a backside surface;
a heat sink disposed above the die; and
a thermal interface material disposed between the die backside surface and the heat sink, wherein the thermal interface material includes a plurality of first metal particles, wherein at least some of the first metal particles include a dielectric film disposed thereon, wherein electrically conductive paths between the die and the heat sink are obstructed by the dielectric film, and wherein the dielectric film is selected from an oxide of the first metal, a nitride of the first metal, an oxynitride of the first metal, a carbide of the first metal, a sulfide of the first metal, a boride of the first metal, a boronitride of the first metal, and combinations thereof; and
wherein the plurality of first metal particles has a heat-transfer capability of unity, and wherein the dielectric film decreases the heat-transfer capability of the first metal to not less than 10 percent of unity.

2. The apparatus of claim 1, wherein a plurality of the first metal particles includes a complete dielectric film.

3. The apparatus of claim 1, wherein a majority of the first metal particles includes a complete dielectric film.

4. The apparatus of claim 1, wherein the dielectric film includes a second metal compound that includes at least one of an oxide of the second metal, a nitride of the second metal, an oxynitride of the second metal, a carbide of the second metal, a sulfide of the second metal, a boride of the second metal, a boronitride of the second metal, and combinations thereof, and wherein the first metal and the second metal are qualitatively different.

5. The apparatus of claim 1, wherein the plurality of first metal particles is present in a particle size range from about 20 nanometers to about 25 micrometers.

6. The apparatus of claim 1, wherein the plurality of first metal particles is present in a particle size range from about 20 nanometers to about 25 micrometers, and wherein the dielectric film includes a thickness relative to the particle size in a range from about 0.1 percent to about 5 percent.

7. The apparatus of claim 1, wherein the thermal interface material further includes a matrix in which the plurality of first metal particles is dispersed.

8. The apparatus of claim 1, wherein the thermal interface material further includes a matrix in which the plurality of first metal particles is dispersed, and wherein the matrix is selected from a polymer, a resin, a thermal grease, a silicone compound, an epoxy, a phase-change material, a metal, and combinations thereof.

9. The apparatus of claim 1, wherein the thermal interface material further includes a matrix in which the plurality of first metal particles is dispersed, wherein the matrix is selected from a polymer, a resin, a thermal grease, a silicone compound, an epoxy, a phase-change material, a metal, and combinations thereof, and wherein the matrix includes a volume of the thermal interface material, relative to the plurality of first metal-particles in a range from about 1 percent to about 70 percent.

10. The apparatus of claim 1, wherein the heat sink is selected from a planar heat slug and an integrated heat spreader.

11. The apparatus of claim 1, wherein the thermal interface material is reworkable.

12. The apparatus of claim 1, further including a backside metallurgy disposed on the backside surface.

13. A system comprising:
a die including an active surface and a backside surface;
a heat sink disposed above the die; and
a thermal interface material disposed between the die backside surface and the heat sink, wherein the thermal interface material includes a plurality of first metal particles, wherein at least a plurality of the first metal particles includes a dielectric film disposed thereon,
wherein electrically conductive paths between the die and the heat sink are obstructed by the dielectric film, and wherein the dielectric film is selected from an oxide of the first metal, a nitride of the first metal, an oxynitride of the first metal, a carbide of the first metal, a sulfide of the first metal, a boride of the first metal, a boronitride of the first metal, and combinations thereof, wherein the plurality of first metal particles has a heat-transfer capability of unity, and wherein the dielectric film decreases the heat-transfer capability of the first metal to not less than 10 percent of unity; and
dynamic random-access memory coupled to the die.

14. The system of claim 13, wherein the system is disposed in one of a computer, a wireless communicator, a hand-held device, an automobile, a locomotive, an aircraft, a watercraft, and a spacecraft.

15. The system of claim 13, wherein the die is selected from a data storage device, a digital signal processor, a micro controller, an application specific integrated circuit, and a microprocessor.

16. An apparatus comprising:
a die including an active surface and a backside surface;
a heat sink disposed above the die; and
a thermal interface material disposed between the die backside surface and the heat sink, wherein the thermal interface material includes a plurality of first metal particles, wherein at least an plurality of the plurality first metal particles include a complete dielectric film disposed thereon, wherein electrically conductive paths between the die and the heat sink are obstructed by the dielectric film, and wherein the at least a plurality of the plurality of first metal particles includes a dielectric film distribution of 40 percent completely encapsulated, 30 percent partially encapsulated, and 30 percent having no dielectric film.

17. The apparatus of claim 16, wherein the at least a plurality of the plurality of first metal particles includes a dielectric film distribution of a majority thereof that is completely encapsulated.

18. An apparatus comprising:
a die including an active surface and a backside surface;
a heat sink disposed above the die; and
a thermal interface material disposed between the die backside surface and the heat sink, wherein the thermal interface material includes a plurality of first metal particles, wherein at least an plurality of the plurality first metal particles include a complete dielectric film disposed thereon, wherein electrically conductive paths between the die and the heat sink are obstructed by the dielectric film, wherein the dielectric film decreases the heat-transfer capability of the first metal to not less than 10 percent of unity, wherein the thermal interface material further includes a matrix in which the plurality of first metal particles is dispersed, wherein the matrix is selected from a polymer, a resin, a thermal grease, a silicone compound, an epoxy, a phase-change material, a metal, and combinations thereof, and wherein the matrix includes a volume of the thermal interface material, relative to the plurality of first metal-particles in a range from about 1 percent to about 70 percent.

19. The apparatus of claim 18 further including:
wherein the dielectric film is selected from an oxide of the first metal, a nitride of the first metal, an oxynitride of the first metal, a carbide of the first metal, a sulfide of the first metal, a boride of the first metal, a boronitride of the first metal, and combinations thereof.

* * * * *